(12) United States Patent
Hoffman et al.

(10) Patent No.: US 11,451,201 B1
(45) Date of Patent: Sep. 20, 2022

(54) DIFFERENTIAL DIODE-BASED VARIABLE IMPEDANCE MODULES

(71) Applicant: MARVELL ASIA PTE, LTD., Singapore (SG)

(72) Inventors: James Hoffman, Thousand Oaks, CA (US); Florin Pera, Ottawa (CA)

(73) Assignee: MARVELL ASIA PTE LTD., Singapore (SG)

( * ) Notice: Subject to any disclaimer, the term of this patent is extended or adjusted under 35 U.S.C. 154(b) by 0 days.

(21) Appl. No.: 16/878,434

(22) Filed: May 19, 2020

(51) Int. Cl.
    *H03L 5/00*     (2006.01)
    *H03F 3/45*     (2006.01)

(52) U.S. Cl.
    CPC ....... *H03F 3/45179* (2013.01); *H03F 3/4508* (2013.01)

(58) Field of Classification Search
    CPC ............... H03F 3/45085; H03F 1/3211; H03F 3/45071; H03F 2203/45702; H03F 3/45089; H03H 11/245; H03K 17/693; H03G 1/0088; H03G 1/007
    USPC ......................................................... 327/308
    See application file for complete search history.

(56) References Cited

U.S. PATENT DOCUMENTS

| | | | | |
|---|---|---|---|---|
| 5,815,034 A * | 9/1998 | Takahashi | ........... | H03F 3/45479 327/563 |
| 7,834,704 B2 * | 11/2010 | Hijikata | ................... | H03F 3/191 330/253 |
| 8,400,224 B1 * | 3/2013 | Au | ........... | H03F 3/191 330/311 |
| 10,447,206 B2 * | 10/2019 | Lee | ......... | H03F 1/0205 |
| 2006/0044061 A1 * | 3/2006 | Mukherjee | ........... | H03F 3/45183 330/253 |
| 2007/0001760 A1 * | 1/2007 | Kwon | ................. | H03F 3/45183 330/253 |
| 2008/0297258 A1 * | 12/2008 | Naito | .................... | H03H 11/245 330/282 |
| 2010/0164621 A1 * | 7/2010 | Srinivasan | ........... | H03F 3/45183 330/253 |
| 2013/0154737 A1 * | 6/2013 | Shu | ........................... | H03F 3/45 330/253 |
| 2013/0307619 A1 * | 11/2013 | Tatsumi | .................. | H03F 3/605 330/252 |
| 2015/0244317 A1 * | 8/2015 | Lv | ......................... | H03B 5/1228 331/115 |
| 2018/0358932 A1 * | 12/2018 | Ostman | ..................... | H03F 1/26 |
| 2019/0081604 A1 * | 3/2019 | Thiagarajan | ............. | H03G 5/28 |

FOREIGN PATENT DOCUMENTS

CN            204335007 U   *   5/2015

* cited by examiner

*Primary Examiner* — Quan Tra

(57) ABSTRACT

The present invention is directed to electrical circuits. More specifically, an embodiment of the present invention provides a variable impedance module with a first capacitor coupled to a first input terminal and the second capacitor coupled to a second input terminal. A diode bridge is connected between the input capacitors. The anodes of the top diodes are connected to a supply through a resistor, and the cathodes of the lower diodes are connected to a high-impedance current source. A third capacitor is connected between these two nodes.

17 Claims, 9 Drawing Sheets

DIFFERENTIAL DIODE-BASED VARIABLE IMPEDANCE MODULES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits.

Variable impedance networks are commonly used components in various broadband and narrowband or radio-frequency (RF) circuit applications. It is often desirable for such a network to approximate an ideal variable capacitor (sometimes also referred to as a "varicap", varactor, etc.), or an ideal variable inductor; however, due to physical parasitic impedances in these networks, the result is typically a non-ideal variable complex impedance. Sometimes, this non-ideal behavior is desirable and the characteristics can be tuned to meet the needs of a particular circuit application. Often, it is beneficial to implement such variable impedance networks in a differential manner, connecting between two out-of-phase nodes. For example, as used in a narrowband circuit, a variable capacitor can act as tuning element in an LC tank within a voltage-controlled oscillator (VCO), which in turn is used for phase or frequency modulation within a phase-locked loop. Similarly, variable capacitors, or inductors can be used to control tunable filters. Broadband analog circuits often employ variable capacitors to achieve an adjustable frequency response.

Although many types of variable impedance networks exist, they are often inadequate in terms of their tuning range, quality factor, or other critical figures of merit. Thus, new and improved variable impedance networks are desired.

BRIEF SUMMARY OF THE INVENTION

The present invention is directed to electrical circuits. More specifically, an embodiment of the present invention provides a variable impedance module with a first capacitor coupled to a first input terminal and the second capacitor coupled to a second input terminal. A diode bridge is connected between the input capacitors. The anodes of the top diodes are connected to a supply through a resistor, and the cathodes of the lower diodes are connected to a high-impedance current source. A third capacitor is connected between these two nodes.

According to an embodiment, the present invention provides a differential variable impedance module, which aims to act as a variable capacitor. This includes a first input terminal. The module also includes an input capacitor coupled to the first input terminal. The module further includes a second input terminal. The module also includes an input capacitor coupled to the second input terminal. The module additionally includes a first diode comprising a first cathode and a first anode. The first cathode is coupled to the first capacitor. The module also includes second diode comprising a second cathode and a second anode. The second cathode is coupled to the second capacitor. The module also includes a first resistor. The anodes of the first and second diode are connected together and connected to a first resistor. The first resistor has its other connection to the supply. The module additionally includes a third diode, comprising a third cathode and a third anode. The third anode is connected to the first cathode and the first capacitor. The module additionally includes a fourth diode, comprising a fourth cathode and a fourth anode. The fourth anode is connected to the second cathode and the second capacitor. The third and fourth cathodes are connected together. The module additionally includes a third capacitor connected between the first and second anodes and the third and fourth cathodes. The module also includes a current source coupled to the third capacitor and the third and fourth cathodes.

According to another embodiment, a present invention provides a variable impedance module, which includes a first input terminal and a first capacitor coupled to the first input terminal. The module further includes a second input terminal and a second capacitor coupled to the second input terminal. The module additionally includes a first diode comprising a first cathode and a first anode. The first cathode is coupled to the first capacitor. The module also includes a second diode comprising a second cathode and a second anode. The second cathode is coupled to the second capacitor. The second anode is coupled to the first anode. The module further includes a third diode comprising a third cathode and a third anode, which is coupled to the first cathode and the first capacitor. The module also includes a fourth diode comprising a fourth cathode and a fourth anode, which is directly coupled to the second cathode and second capacitor and the fourth cathode being connected to the third cathode. The module also includes a third capacitor coupled to the first anode and a fourth capacitor coupled to the third cathode.

According to yet another embodiment, the present invention provides a differential amplifier, which includes a first input switch comprising a first emitter terminal, a first base terminal, and a first collector terminal. The first base terminal is coupled to a first input terminal and the first collector terminal being coupled to a first output terminal. The amplifier also includes a second input switch comprising a second emitter terminal, a second base terminal, and a second collector terminal. The second base terminal is coupled to a second input terminal and the second collector terminal being coupled to a second output terminal. The amplifier further includes a resistor coupled to the first emitter and the second emitter terminals.

It is to be appreciated that embodiments of the present invention provide many advantages over conventional techniques. Among other things, impedance modules according to the present invention provide excellent tuning range, low distortion, and low parasitic capacitance. Additionally, differential amplifiers and other circuits implemented with impedance modules of the present invention provide excellent quality factor. There are other benefits as well.

Embodiments of the present invention can be implemented in conjunction with existing systems and processes. For example, embodiments of the present invention can be manufactured using existing equipment and processes. Additionally, impedance modules according to embodiments of the present invention can be readily incorporated into existing systems and devices.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
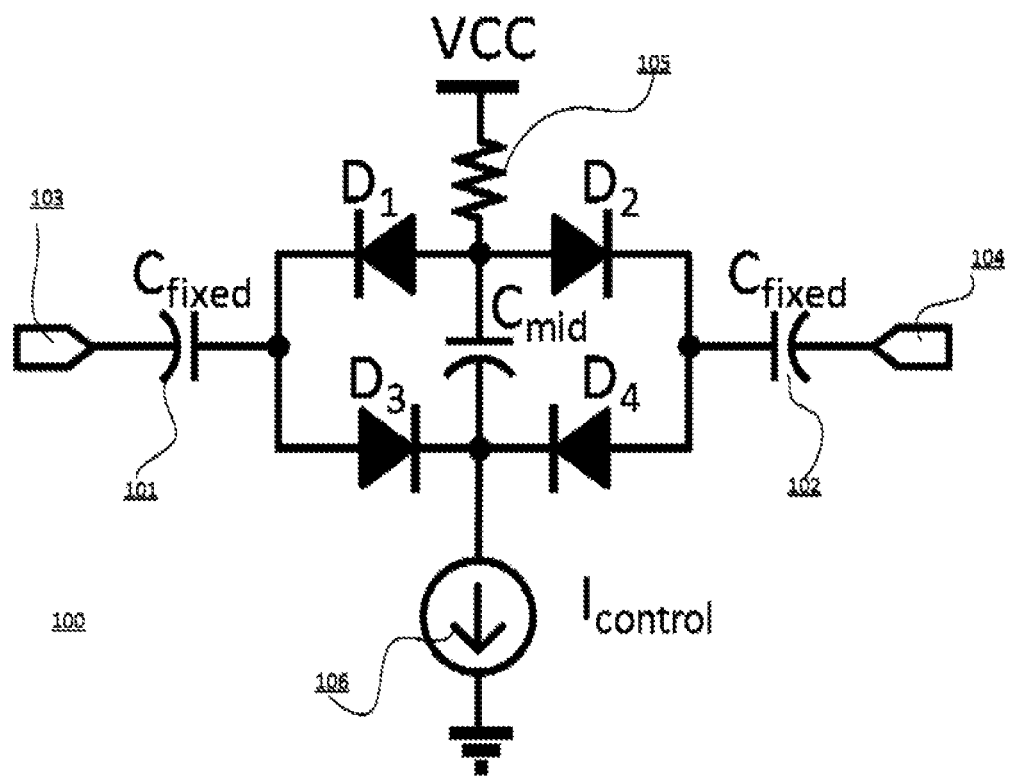
FIG. 1 is a simplified diagram illustrating a variable impedance module 100 according to embodiments of the present invention.

The present invention is directed to electrical circuits. More specifically, an embodiment of the present invention provides a variable impedance module with a first capacitor coupled to a first input terminal and the second capacitor coupled to a second input terminal. A diode bridge is connected between the input capacitors. The anodes of the top diodes are connected to a supply through a resistor, and the cathodes of the lower diodes are connected to a high-impedance current source. A third capacitor is connected between these two nodes.

As explained above, conventional variable complex impedance networks are inadequate. In various applications, it is usually desirable to have a wide tuning range, low distortion (e.g., usually measured in terms of harmonic generation) in output signal, low parasitic capacitance, a high quality-factor (Q), and a small footprint. It is also beneficial to be able to implement a simple control circuitry, where the tuning can be either continuous or discrete. Such variable impedance modules could be implemented to approximate ideal variable capacitors, variable inductors, or a more generalized variable complex impedance. The present invention is aimed at approximating an ideal differential variable capacitor, but it could be easily adapted to different impedance requirements. Such variable capacitors should be able to be readily integrated on-chip in an integrated circuit (IC). In various implementations, differential impedance modules according to the present invention provide a superior tuning range in comparison to conventional variable capacitors of similar size, while maintaining low distortion and a high-quality factor. Additionally, variable impedance modules according to embodiments of the present invention are far more suitable for high-frequency applications due to their reduced parasitic capacitance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a variable impedance module 100 according to embodiments of the present invention. This diagram is merely an example, which should not unduly limit the scope of the claims. One of ordinary skill in the art would recognize many variations, alternatives, and modifications. For example, capacitors $C_{mid}$, and $C_{fixed}$ may be replaced with inductors or a combination or real and imaginary impedance elements to create a response that differs from a variable capacitor. The differential impedance of variable impedance module 100—as used as a part of a device (e.g., differential amplifier, VCO, filter)—is configured between terminals 103 and 104. The network of diodes that includes D1-D4 functions effectively as an impedance divider between the two fixed capacitors 101 and 102. For example, the arrangement of diodes D1-D4 may be referred to as a diode bridge configuration. Capacitor $C_{mid}$ is configured between the diodes to provide a continuous tuning range. For example, diodes D1-D4 are implemented using diodes optimized for high-frequency switch applications, having a low $R_{on}*C_{off}$ product. For example, diodes D1-D4 can be implemented using various types of diodes, such as Schottky diodes, PIN diodes, P-N junction diodes, and bipolar junction (or bipolar heterojunction) transistor-based diodes. It is to be appreciated that these diodes, as used according to embodiments of the present invention, are small, energy efficient, and inexpensive, and can be readily integrated into existing devices. Current source 106 provides a control current $I_{control}$ that controls the biasing of diodes D1-D4. For example, with forward biasing, diodes D1-D4 are conducting and operate as low-value resistors (of value $R_{on}$) with a large shunt capacitor, representing the diode diffusion capacitance. With zero or reverse biasing, diodes D1-D4 are not conducting and operate as a very large resistance with a small shunt capacitance, $C_{off}$, representing the diode depletion capacitance. When $I_{control}$ is zero, additional pull-up circuitry can be used to reverse-bias the diodes and reduce their off-capacitance. In various implementations, current source 106 receives control signal from a controller module (not shown) to adjust impedance of variable capacitor module 100. One of the advantages is that current-based control does not require a sense voltage or closed-loop control, thereby simplifying the system.

It is to be appreciated that variable impedance module 100 provides many benefits. Using diodes with a low $C_{off}$ and fixed capacitors with low parasitic capacitance to ground allows variable impedance module 100 to achieve excellent capacitance control range, with minimal loading on the connecting circuitry. Similarly, diodes with a low $R_{on}$ increase the quality factor of the network, hence making them more suitable for use in VCO and high-frequency applications. By utilizing a small internal capacitor (e.g., $C_{mid}$), variable impedance module 100 can be used throughout its tuning range with minimal or zero distortion penalties. The inclusion of capacitor $C_{mid}$ also removes the need for decoupling to ground, which in some applications is beneficial for maintaining a high common mode rejection ratio (CMRR). Depending on the implementation, the impedance of variable capacitor module 100 can be controlled using an analog or digital signal, as described below.

In various embodiments, the diodes are substantially equal sized. The size of the diodes is based on the specific implementation and applications: small diodes provide low parasitic capacitance, and hence $C_{off}$, while increasing the on-state resistance, $R_{on}$. Large diodes have a lower $R_{on}$, but a higher off-state capacitance, $C_{off}$. Hence, the diode area can be optimized given the desired tuning range or size of $C_{fixed}$, the desired control current, and the desired quality factor.

In various embodiments, resistor 105 is sized such that it provides a large enough impedance (over frequency) to isolate the circuit from the low-impedance VCC node. For example, the upper limit depends on the limits of the biasing circuitry.

The capacitor $C_{mid}$, in various embodiments, is sized to provide a low-impedance path between its nodes down to differential low-frequency cutoff of the module itself. In various implementations, the size of capacitor should be on the order of $C_{fixed}/2$. Different applications of the variable impedance module may not require $C_{mid}$.

Figure 2:
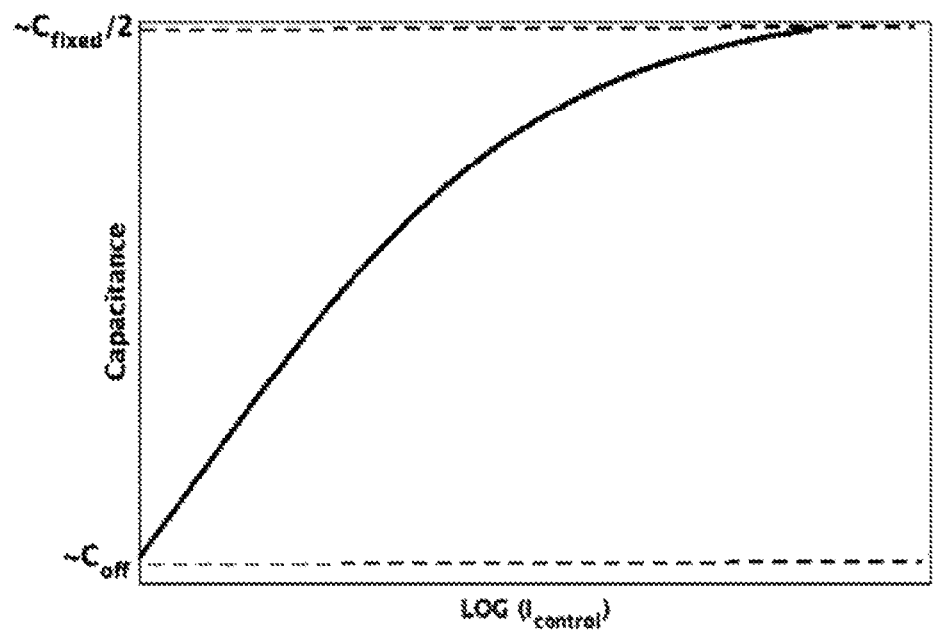
FIG. 2 is a plot illustrating operation of the variable impedance module 100.

FIG. 2 is a plot illustrating operation of variable impedance module 100. As shown, the effective differential capacitance is substantially linear relative to the logarithm of the control current, $I_{control}$. When $I_{control}$ is zero, the variable series resistor-capacitor is characterized by a capacitance of $C_{min}$, which is limited by the off-capacitance, $C_{off}$, of the diodes. As $I_{control}$ increases, the effective differential capacitance of variable impedance module 100 increases as well, tending towards half the value of $C_{fixed}$ (e.g., capacitors 101 and 102 in FIG. 6).

Figure 3:
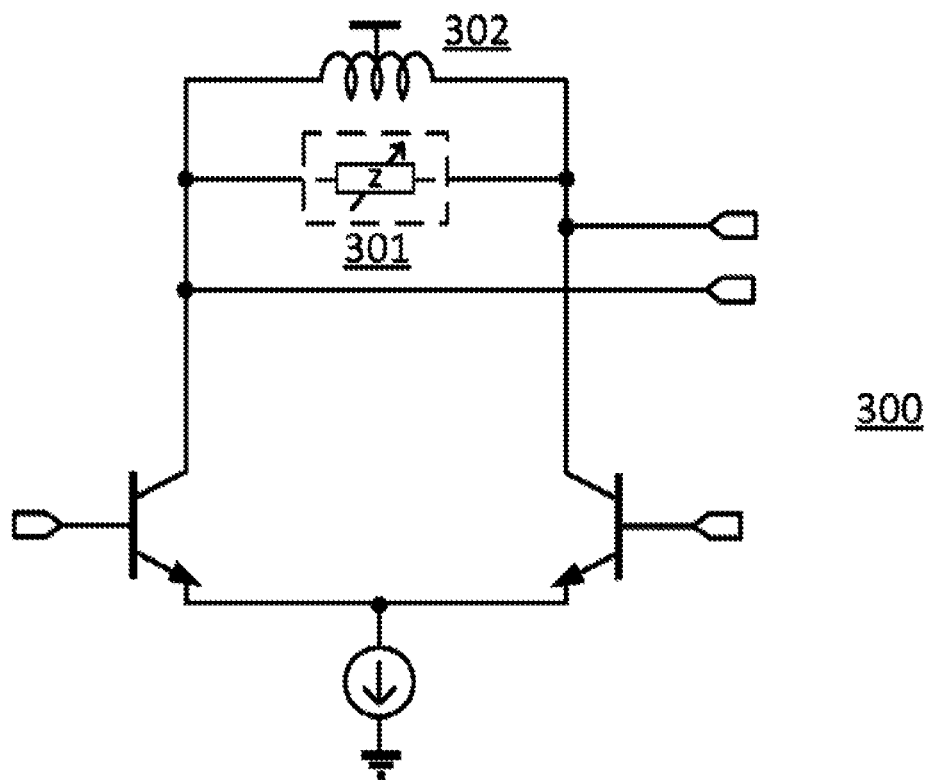
FIG. 3 is a simplified diagram illustrating a differential tuned amplifier 300 implemented with a variable impedance module according to embodiments of the present invention.

FIG. 3 is a simplified diagram illustrating a differential narrow-band amplifier implemented with a variable capacitor network according to embodiments of the present invention. This diagram is merely an example, which should not unduly limit the scope of the claims. One of ordinary skill in the art would recognize many variations, alternatives, and modifications. Differential amplifier 300 is implemented using variable impedance module 301 as part of the LC tank along with inductor 302. Differential amplifier 300 is implemented using NPN bipolar transistors, but it is be understood that different device types (e.g., using PNP bipolar transistors, n-type or p-type MOSFETs) are possible as well. Likewise differential amplifier 300 is shown utilizing a conventional differential common-emitter (differential pair) architecture, but it is understood that other tuned amplifier topologies are equally applicable. As discussed earlier, variable impedance module 301 actually represents a variable differential complex impedance that could be modified to implement a more general variable complex impedance as desired, including a variable inductor or transformer.

Figure 4:
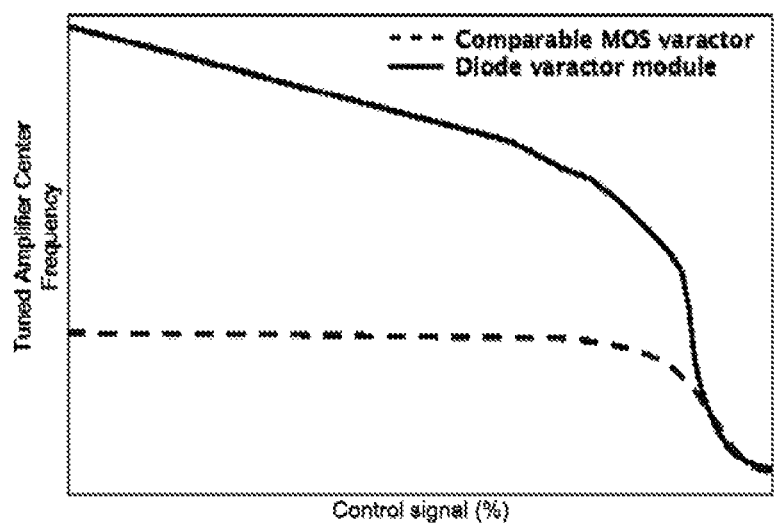
FIG. 4 is a plot demonstrating the tuning range of differential amplifier 300 when using variable impedance module 100 according to embodiments of the present invention versus when using a comparable MOS varactor.

FIG. 4 is a plot of the center frequency of differential amplifier 300 as a function of the control signal when using a conventional MOS varactor and when using variable impedance module 100, implemented according to the embodiments of the present invention. This figure illustrates the increased tuning range offered by variable impedance module 100. This diagram is merely an example, which should not unduly limit the scope of the claims. One of ordinary skill in the art would recognize many variations, alternatives, and modifications.

Figure 5:
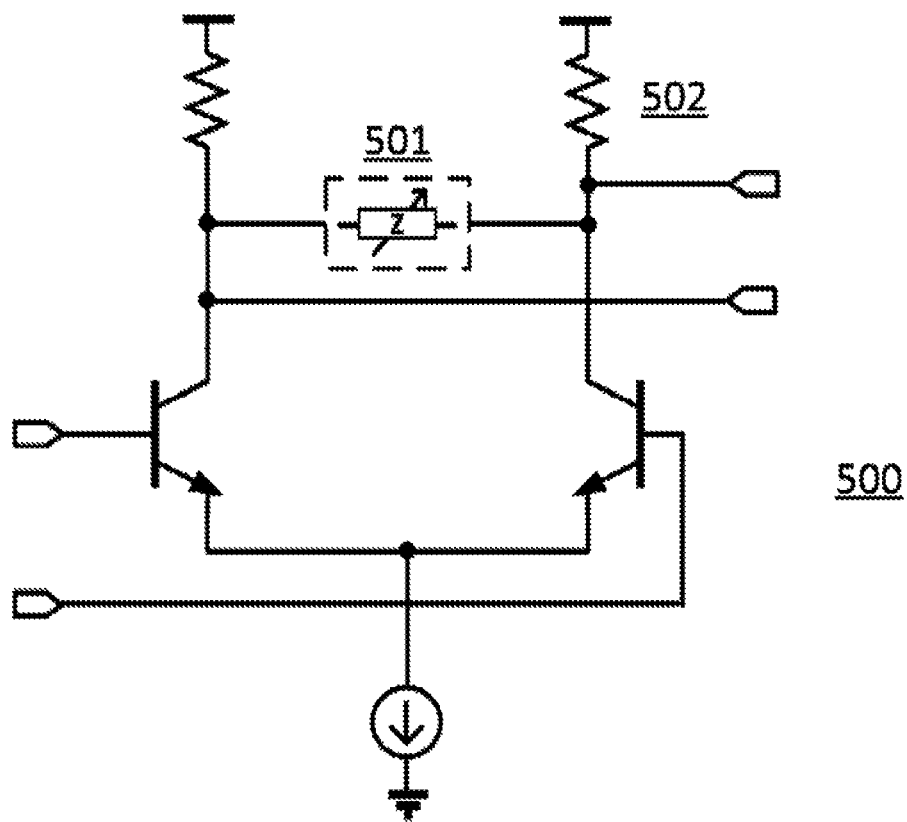
FIG. 5 is a simplified diagram illustrating a broadband differential amplifier 500 implemented with a variable impedance network according to embodiments of the present invention.

FIG. 5 is a simplified diagram illustrating a broadband differential amplifier 500 implemented with a variable impedance module according to embodiments of the present invention. This diagram is merely an example, which should not unduly limit the scope of the claims. One of ordinary skill in the art would recognize many variations, alternatives, and modifications. Differential inputs are coupled to base terminals of input bipolar devices. Resistor 502 is the load resistor at each output, connected to the collectors. Variable impedance module 501 is connected between the differential outputs. The output time constant of differential amplifier 500 is dependent on resistor 502 and variable impedance module 501. Hence, differential amplifier 500 is implemented with an adjustable frequency response, using variable impedance module 501. Differential amplifier 500 is implemented using NPN bipolar transistors, but it is be understood that different device types (e.g., using PNP bipolar transistors, n-type or p-type MOSFETs) are possible as well. Likewise, differential amplifier 500 is a simple broadband differential common-emitter architecture, but it is to be understood that other circuits (e.g., other broadband amplifier topologies, narrowband amplifier topologies, designs employing feedback, variable gain amplifiers, or discrete-time circuits). Finally, differential amplifier 500 has variable impedance module 501 connected at its outputs. However, it is to be understood that this module could be connected between any nodes that lead to a desired adjustable response (e.g., connected between other differential nodes in a circuit, connected in a feedback path, etc.).

Figure 6:
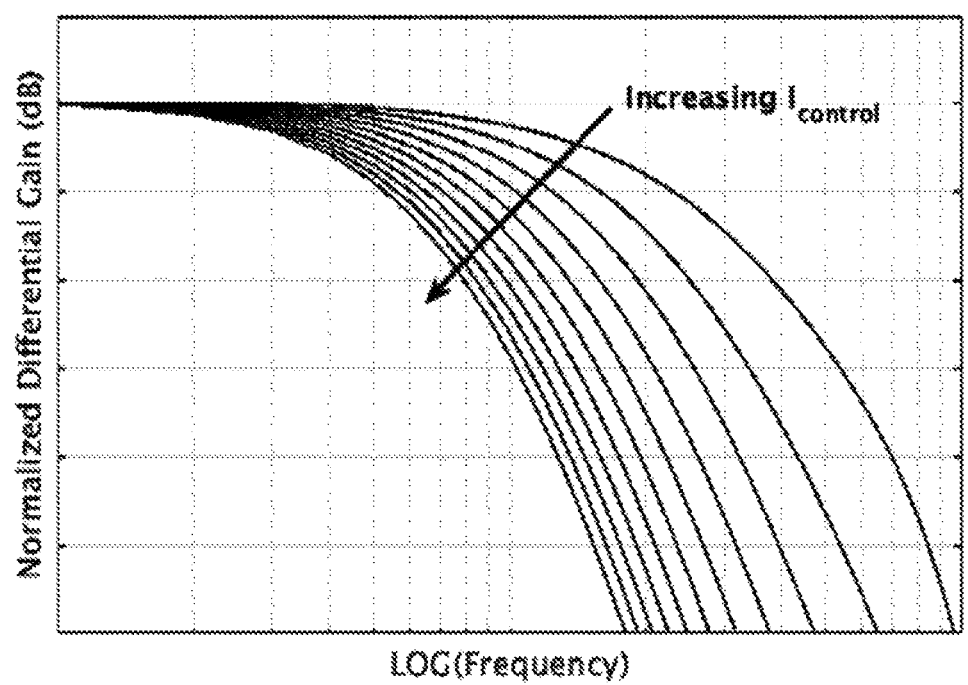
FIG. 6 is a plot illustrating normalized differential gain relative to control current $I_{control}$ at different frequencies according to embodiments of the present invention.

FIG. 6 is a plot illustrating normalized differential gain of amplifier 500 with variable impedance module 501 implemented according to the embodiments of the present invention. It can be seen that the control current $I_{control}$ can be used to adjust the frequency response of the amplifier by changing its output pole.

Figure 7:
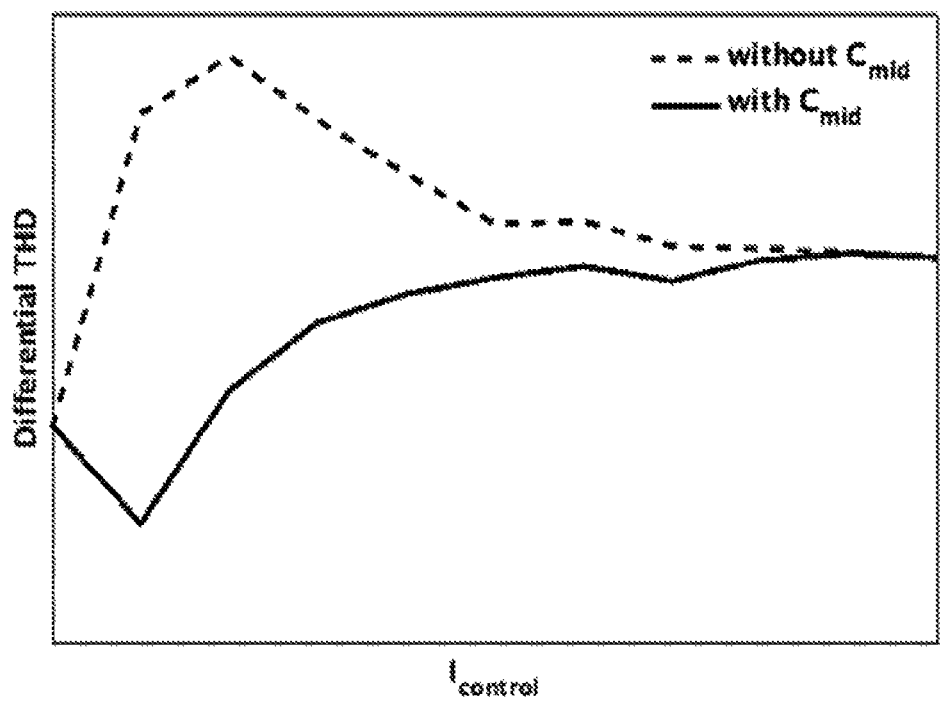
FIG. 7 is a plot that shows the THD of a differential amplifier's output signal, where variable capacitor module 500 is used to control the frequency response across its tuning range.

FIG. 7 is a plot that shows the THD of a differential amplifier's output signal, where variable impedance module 500 is used to control the frequency response across its tuning range. As can be seen in FIG. 7, capacitor $C_{mid}$ significantly reduces the undesirable differential THD throughout the $I_{control}$ range.

Now referring back to FIG. 1. As explained above, current source 106 provides a control signal $I_{control}$ for adjusting the impedance of variable impedance module 100. For example, current source 106 can be implemented in various ways according to embodiments of the present invention.

Figure 8:
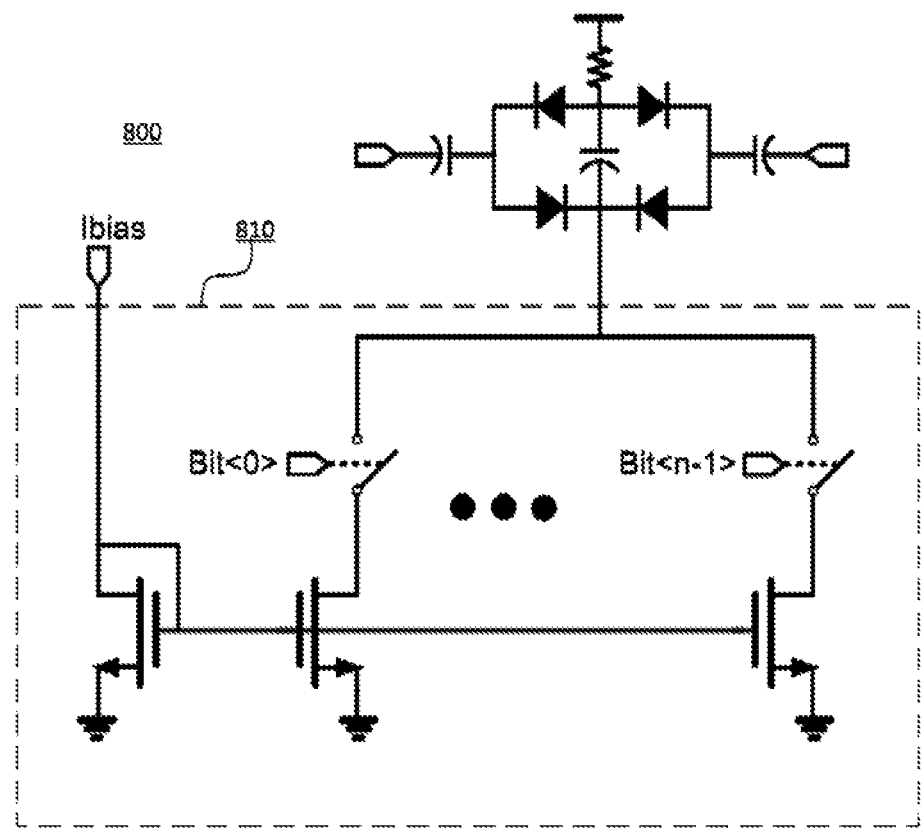
FIG. 8 is a simplified diagram illustrating a digital control scheme according to embodiments of the present invention.

FIG. 8 is a simplified diagram illustrating a digital control scheme according to embodiments of the present invention. This diagram is merely an example, which should not unduly limit the scope of the claims. One of ordinary skill in the art would recognize many variations, alternatives, and modifications. The adjustable current source 810 controls the variable impedance module implemented according to embodiments of the present invention. Current source 810 is implemented as a component of the variable impedance module 800. Among other functions, current source 810 determines biasing of the diodes, which in turn controls the differential impedance value of the variable impedance module 800. For example, current source 810 is implemented using n-type MOSFET current sources, but it is understood that other implementations (e.g., BJT, p-type MOSFET, etc.) are possible as well. For example, the control current $I_{control}$ is determined by n control signals "Bit<0>" through "Bit<n–1>" coupled to idealized switches. The sizing of the MOSFET current sources can be chosen to be weighted in the actual implementation to steer any fraction of $I_{bias}$. In various embodiment, the n control signals may be generated by a control circuit (not shown) using a look up table based on a target capacitance.

Figure 9:
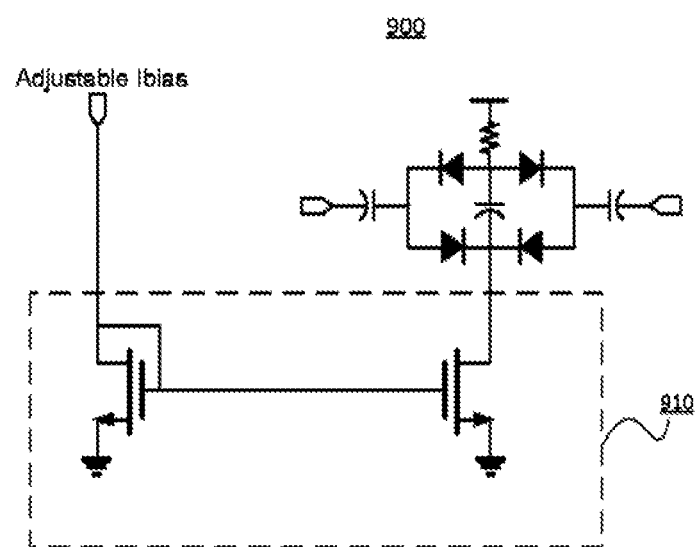
FIG. 9 is a simplified diagram illustrating an analog control scheme according to embodiments of the present invention.

FIG. 9 is a simplified diagram illustrating an analog control scheme. The adjustable current source 910 controls variable impedance module implemented according to embodiments of the present invention. This diagram is merely an example, which should not unduly limit the scope of the claims. One of ordinary skill in the art would recognize many variations, alternatives, and modifications. Current source 910 includes an n-type MOSFET current mirror with an incoming adjustable current $I_{bias}$. The control current $I_{control}$ is thus a function of the bias current $I_{bias}$. It is understood that analog current source can be implemented in other ways as well. For example, the incoming adjustable current $I_{bias}$ is provided by a control circuits (not shown) that adjusts the magnitude of current $I_{bias}$ based on a target capacitance value.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable impedance module comprising:
    a first input terminal;
    a first capacitor coupled to the first input terminal;
    a second input terminal;
    a second capacitor coupled to the second input terminal;
    a first diode comprising a first cathode and a first anode, the first cathode being coupled to the first capacitor;
    a second diode comprising a second cathode and a second anode, the second cathode being coupled to the second capacitor, the second anode being coupled to the first anode;
    a third diode comprising a third cathode and a third anode, the third anode being coupled to the first cathode and the first capacitor;
    a fourth diode comprising a fourth cathode and a fourth anode, the fourth anode being directly coupled to the second cathode and second capacitor and the fourth cathode being connected to the third cathode; and
    a third capacitor coupled between the first anode and the third cathode.

2. The module of claim 1 further comprising a resistor coupled to the first anode and a current source coupled to the third cathode.

3. The module of claim 2 further comprising a voltage source coupled to the resistor.

4. The module of claim 1 further comprising a resistor coupled to the third cathode and a current source coupled to the first anode.

5. The module of claim 2 wherein the current source comprises a MOSFET switch whose gate terminal is coupled to a digital control signal.

6. The module of claim 2 wherein the current source comprises a MOSFET switch whose gate terminal is coupled to an analog control.

7. A differential amplifier comprising:
    a first input switch comprising a first emitter terminal, a first base terminal and a first collector terminal, the first base terminal being coupled to a first input terminal and the first collector terminal being coupled to a first output terminal;
    a second input switch comprising a second emitter terminal, a second base terminal and a second collector terminal, the second base terminal being coupled to a second input terminal and the second collector terminal being coupled to a second output terminal; and
    a variable impedance module coupled to the first collector and the second collector terminals, the variable impedance module configured to vary impedance between the first collector and the second collector terminals,
    wherein the variable impedance module comprises four diodes arranged in a bridge including a first pair of series-connected diodes connected in parallel to a second pair of series-connected diodes, a plurality of capacitors connected to the bridge, and a current source configured to bias the diodes in the bridge.

8. A differential amplifier comprising:
    a first input switch comprising a first emitter terminal, a first base terminal and a first collector terminal, the first base terminal being coupled to a first input terminal and the first collector terminal being coupled to a first output terminal;
    a second input switch comprising a second emitter terminal, a second base terminal and a second collector terminal, the second base terminal being coupled to a second input terminal and the second collector terminal being coupled to a second output terminal; and a variable impedance module coupled to the first collector and the second collector terminals, the variable impedance module configured to vary impedance between the first collector and the second collector terminals;
wherein the variable impedance module comprises:
a third input terminal coupled to the first collector terminal;
a first capacitor coupled to the third input terminal;
a fourth input terminal coupled to the second collector terminal;
a second capacitor coupled to the fourth input terminal;
a first diode comprising a first cathode and a first anode, the first cathode being coupled to the first capacitor;
a second diode comprising a second cathode and a second anode, the second cathode being coupled to the second capacitor, the second anode being coupled to the first anode;
a third diode comprising a third cathode and a third anode, the third anode being coupled to the first cathode and the first capacitor;
a fourth diode comprising a fourth cathode and a fourth anode, the fourth anode being coupled to the second cathode and second capacitor and the fourth cathode being coupled to the third cathode;
a third capacitor coupled between the first anode and the third cathode;
a resistor coupled to the first anode; and
a first current source coupled to the third cathode.

9. The differential amplifier of claim 7 wherein the first input switch and the second input switch are NPN-type BJT.

10. The differential amplifier of claim 7 wherein the first input switch and the second input switch are n-channel MOSFET.

11. The differential amplifier of claim 8 further comprising an inductor coupled to the first collector and the second collector wherein the inductor and the variable impedance module form a tank circuit.

12. The differential amplifier of claim 11 further comprising a voltage source coupled to the inductor.

13. The differential amplifier of claim 11 further comprising a second current source coupled to the first emitter and the second emitter terminals.

14. The differential amplifier of claim 8 further comprising:
a first resistor coupled to the first collector terminal;
a second resistor coupled to the second collector terminal; and
a voltage source coupled to the first and second resistors.

15. The differential amplifier of claim 14 further comprising a second current source coupled to the first emitter and the second emitter terminals.

16. A circuit comprising:
the variable impedance module of claim 1;
N first switches, where N is an integer greater than 1, each of the N first switches having a first terminal coupled to the third cathode via N second switches, respectively, a second terminal connected to a reference potential, and a control terminal, wherein the N second switches are controlled by respective control signals to control a current through the variable impedance module that controls biasing of the first through fourth diodes; and
a third switch having a first terminal coupled to a control signal, a second terminal connected to the reference potential, and a control terminal coupled to the first terminal of the third switch and to the control terminals of the N first switches.

17. A circuit comprising:
the variable impedance module of claim 1;
a first switch having a first terminal coupled to the third cathode, a second terminal connected to a reference potential, and a control terminal; and
a second switch having a first terminal coupled to a control signal, a second terminal connected to the reference potential, and a control terminal coupled to the first terminal of the second switch and to the control terminal of the first switch.

* * * * *